(12) United States Patent
Miller

(10) Patent No.: US 7,004,373 B1
(45) Date of Patent: Feb. 28, 2006

(54) WIRE BOND FAULT DETECTION METHOD AND APPARATUS

(75) Inventor: Charles F. Miller, Anaheim Hills, CA (US)

(73) Assignee: West Bond, Inc., Anaheim, CA (US)

(*) Notice: Subject to any disclaimer, the term of this patent is extended or adjusted under 35 U.S.C. 154(b) by 185 days.

(21) Appl. No.: 10/408,429

(22) Filed: Apr. 7, 2003

(51) Int. Cl.
*B23K 31/02* (2006.01)

(52) U.S. Cl. .................................. 228/103; 228/180.5

(58) Field of Classification Search ................ 228/4.5, 228/180.5, 103; 242/420.6, 412.2, 413.5, 242/418.1
See application file for complete search history.

(56) References Cited

U.S. PATENT DOCUMENTS

| | | | |
|---|---|---|---|
| 4,019,669 A * | 4/1977 | Tanimoto et al. ............. | 228/4.5 |
| 4,572,421 A * | 2/1986 | Hug et al. .................... | 228/103 |
| 4,763,826 A * | 8/1988 | Kulicke et al. .............. | 228/4.5 |
| 4,909,431 A * | 3/1990 | Japichino et al. ........... | 228/103 |
| 5,016,803 A * | 5/1991 | Ohashi et al. ............... | 228/4.5 |
| 5,402,927 A * | 4/1995 | Frasch ....................... | 228/180.5 |
| 5,526,975 A * | 6/1996 | Endo .......................... | 228/103 |
| 5,791,550 A * | 8/1998 | Kobayashi ............... | 228/180.5 |
| 6,082,657 A * | 7/2000 | Chen et al. ............... | 242/420.6 |

* cited by examiner

*Primary Examiner*—Jonathan Johnson
(74) *Attorney, Agent, or Firm*—Willaim L. Chapin

(57) ABSTRACT

A method and apparatus for confirming whether wire bonds are successfully made to sites on a workpiece by an ultrasonic bonding tool using wire supplied to an entrance bore through the tool from a despooling wire supply spool, and for providing a fault detection status signal if bonds are not successfully made, utilizes an automatic wire despooler which includes a spool drive motor for rotating a wire supply spool to thereby pay out wire from the supply spool to form a drooping catenary-shaped length of slack wire, located between the spool and an output wire guide having an aperture through which wire is supplied to a bonding machine head that supports an ultrasonic bonding tool. The apparatus includes a proximity-type feed sensor for detecting when the catenary straightens and shortens a predetermined amount in response to tension caused by moving the tool tip between successive bond sites, thereby drawing wire out through an exit opening of the bonding tool bore. Shortening the slack length a predetermined amount straightens and elevates the center part or vertex of the catenary upwardly towards the proximity sensor; when the slack length is sufficiently short, the catenary vertex is brought into the detection range of the proximity sensor, which then outputs an electrical signal that causes the drive motor to rotate a predetermined amount in a forward sense, paying out wire from the supply spool and increasing the length of the slack length catenary segment to a value which causes the catenary to droop below the detection range of the proximity sensor. After each wire interconnection made between a pair of bond sites of normal or greater length, or a small number of very short interconnections, the proximity sensor is interrogated by a computer logic means to determine that the despooler has been run to advance at least the minimum length of wire. If there has been no run, a bond fault alarm status signal is generated, halting further bonding operations.

23 Claims, 11 Drawing Sheets

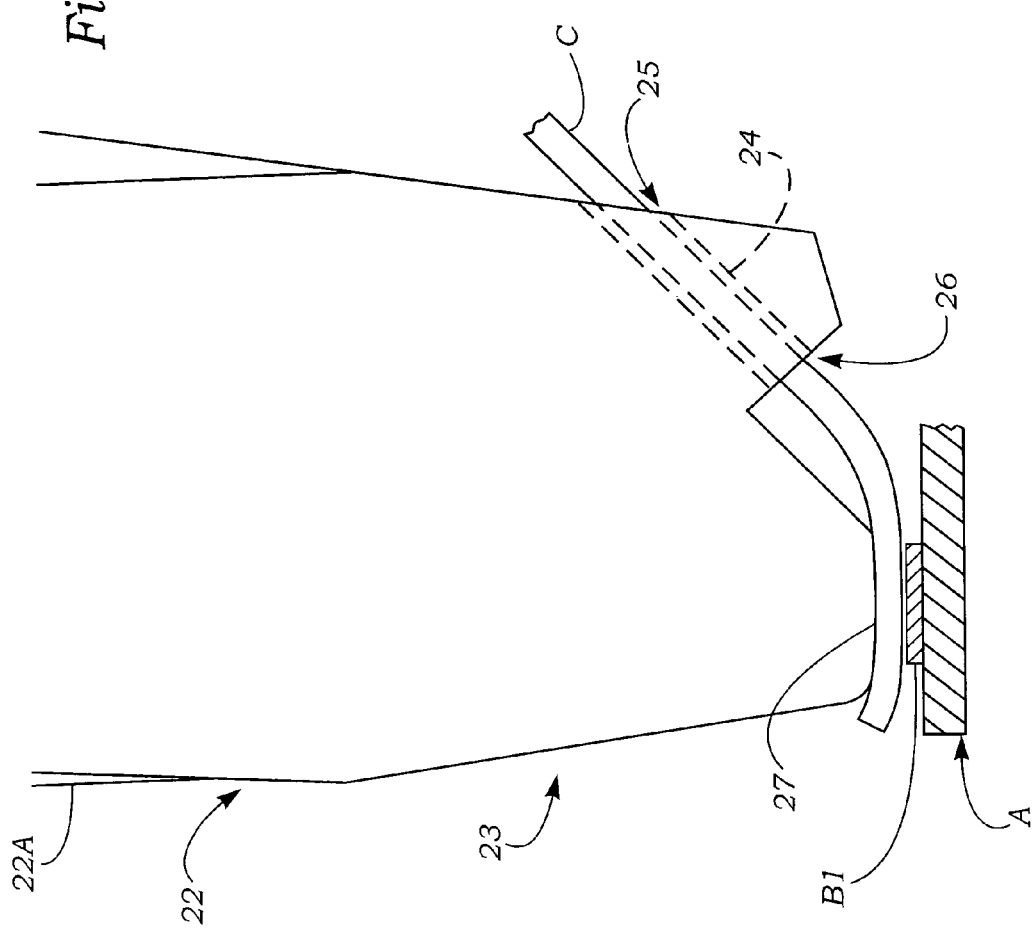

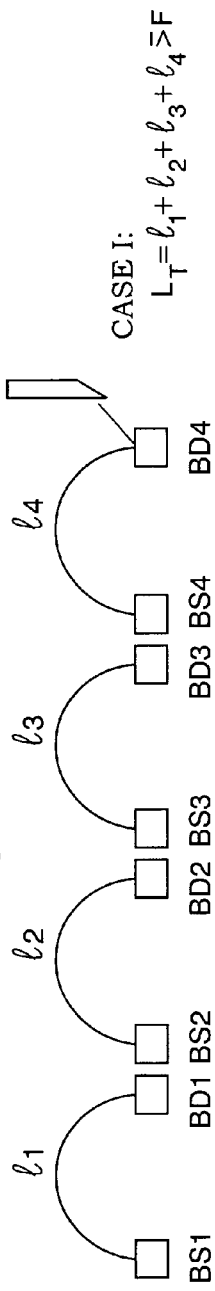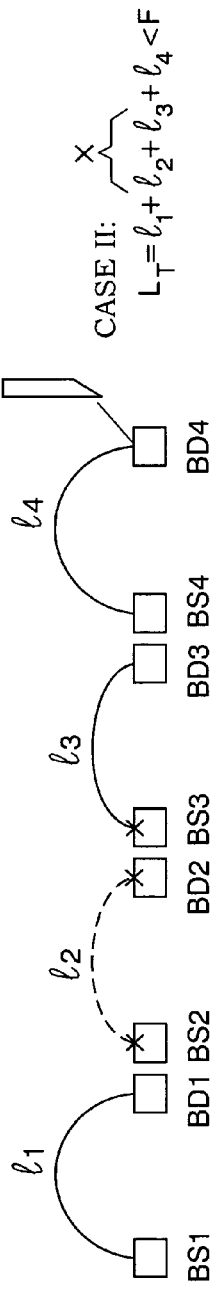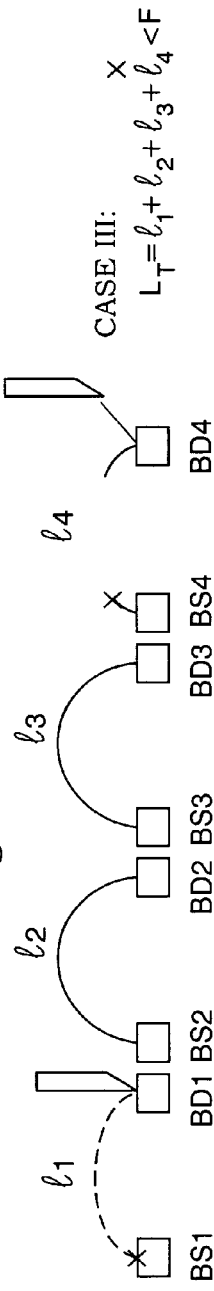

WIRE BOND FAULT DETECTION METHOD AND APPARATUS

BACKGROUND OF THE INVENTION

A. Field of the Invention

The present invention relates to ultrasonic bonding machines of the type which use an ultrasonically vibrated tool to bond conductive interconnecting wires to conductive sites on miniature electronic devices such as integrated circuits and magnetic read/write heads used in disk drive memories. More particularly, the invention relates to a method and apparatus for detecting failure of an ultrasonic bonding tool of a bonding machine used to make a sequence of wire interconnections between pairs of bond sites, to bond a wire to one or more of such sites.

B. Description of Background Art

Miniature electronic circuits, or "micro-circuits," are used in vast quantities, in a wide variety of consumer, commercial, industrial and military devices and equipment. The majority of such micro-circuits are of a type referred to as integrated circuits. Integrated circuits contain a number of active circuit elements such as transistors, and passive elements such as resistors and capacitors mounted on a substrate. Semiconductor integrated circuits consist of a small monolithic chip made of a semiconducting material such as silicon having discrete areas into which impurities are diffused to form circuit elements and having conductive paths between circuit elements on the chip formed by selectively etching metallized layers of the chip. In hybrid micro-circuits, circuit elements mounted on a ceramic substrate are usually interconnected by conductive ink paths on the substrate.

Functional portions of integrated circuits are typically in the form of very small, rectangular-shaped chips, ranging in size from 0.025 inch to 0.200 inch or more on a side. Input connections to integrated circuit chips are often made by bonding a very fine wire to electrically conductive pads on the chips, the other end of each wire being bonded to a conductive terminal that is sufficiently large and robust to be soldered to conductors on a circuit board. Wire bonding of this type utilizes ultrasonic energy and/or heat to form an intermetallic bond or weld between the wire and metallic bond site. Such wire bonds are used to form interconnections between conductive pads of an integrated circuit chip and terminals of a package used to enclose and protect the chip, and are also used to connect lead-out terminals to delicate read/write heads used in disk memories.

Bonding wires used to interconnect the pads of a semiconductor chip to terminals of a package containing the chip are generally made of aluminum or gold, and have a diameter of about 1 mil (0.001 inch) or less. Each interconnecting wire must be bonded to the upper surface of a small, typically rectangular-shaped, integrated circuit pad a few mils wide at one end of the wire to form a first bond site, and to another similarly shaped pad, or to a larger package terminal comprising a second bond site. In some cases, a length of bonding wire is interconnected to three or more pads, in a "daisy-chain" fashion referred to as stitch bonding.

The most common method of interconnecting wires between bond sites such as semiconductor chip pads and/or external terminals uses ultrasonic energy to form a welded bond at each end of a conducting wire. To form such bonds, a free end of a length of bonding wire protruding from the tip of a tapered pencil-shaped bonding tool is placed in contact with a pad. The tool tip is then pressed against the wire, and energized with ultrasonic energy supplied by an ultrasonic transducer for a short time interval. The combination of a normally downwardly directed pressure applied by the tool to the contact region between the lower surface of the wire and the upper surface of the pad, combined with an oscillatory scrubbing motion at an ultrasonic frequency of the tool tip, in a horizontal direction parallel to the pad, causes an inter-molecular diffusion bond, sometimes referred to as a "weld," to be formed between the wire and pad. The tool is then moved in an arc-shaped path to another bond site. Motion of the tool tip away from a first, "source" bond site to a second "destination" bond site causes wire supplied from a supply reel or spool to an upper entrance opening of a wire feed bore through the tool, to be withdrawn from a lower exit opening of the bore and form an arch-shaped interconnecting segment between the first and second bond sites. The tool is then moved downwardly to press a trailing portion of the wire segment against the second bond site, and the ultrasonic transducer once again energized to bond the trailing end of the wire to the second bond site. After the second or last bond in a series of bonds has been thus formed, the wire is severed at the last bond site.

In view of the very small sizes of both the micro-circuit pads and bonding wire, it can be appreciated that ultrasonic bonding of connecting wires to integrated circuit pads or similar bond sites must be performed using an apparatus such as a bonding machine which permits the tool to be manipulated to precisely controllable positions within a coordinate space which encompasses a work area containing a workpiece.

Typical wire bonding machines used for ultrasonic welding of wires to micro-circuit pads include an elongated, generally cylindrically shaped force-applying member or "tool" which has a pointed lower end. The tool is usually vertically disposed, and has a shank mechanically coupled at an upper end thereof to a source of ultrasonic energy, such as a piezoelectric transducer which is connected to an electrical energy source alternating at an ultrasonic frequency. Usually, the tool is connected to the transducer through a tapered horn structure that matches the acoustic input impedance of the tool to the output impedance of the transducer, which typically has a larger diameter than the tool shank.

One type of ultrasonic bonding tool used to bond wires to micro-circuit pads is referred to as a wedge bonder and has a flat lower working face adapted to press a bonding wire into contact with a pad while ultrasonic energy is applied through the tool to the wire to form an ultrasonic weld. This working face is usually quite small, typically having a rectangular shape only about a few mils on a side, to permit bonding wire to small micro-circuit pads, without contacting adjacent circuit elements. The bonding process typically includes the steps of first viewing a particular workpiece pad and tool tip in a stereo microscope and video camera to align a workpiece relative to a bonding machine, and then using an automatic actuator system to position the tool tip at consecutive bond site locations on the workpiece, using a control system which employs pattern recognition logic.

In most wire bonding machines which use a wedge bonding tool, the bonding tool is so constructed as to facilitate the positioning of bonding wire over a pad, prior to performing the bonding operation. Such bonding tools typically include an oblique face which angles upwardly and rearwardly from a flat lower working face referred to as a "foot," and have a generally vertically disposed rear side. An angled wire guide or wire feed bore having an entrance aperture in the rear side and an exit aperture in the angled lower face of the tool, rearward of the foot, is provided to enable bonding wire supplied from a reel or spool mounted upwardly and rearwardly of the tool to enter the entrance aperture of the wire feed bore, pass freely through the bore, and to be paid or drawn out through the exit aperture in the angled lower face of the tool. Typically, a remotely actuable wire clamp located rearward of the wire feed bore entrance aperture and movable with respect to the tool is used to feed bonding wire through the wire feed bore.

The wire clamp used to push wire through the wire guide bore of a bonding tool typically consists of a pair of jaws or clamp blades that may alternately be closed to grip the wire, and opened to allow free travel of the wire. Generally, such clamps may be moved toward and away from the guide bore entrance, typically on a line of movement which coincides with the axis of the guide bore. To feed wire through the guide bore, the jaws of the clamp are first opened, and the clamp then moved away from the guide bore. The jaws are then closed to grip the wire, and then moved towards the guide bore, thus feeding wire through the guide bore.

In wire bonding machines of the type described above, the machine is used to translate the bonding tool horizontally to locate the tool tip over a first bond site of a pair of bond sites, such as a pad on an integrated circuit die. The bonding tool is then moved downwardly to press a bonding wire into contact with the first bond site, and the tool is ultrasonically energized to make the first bond. The tool is then translated upwardly from the first bond site, and horizontally to a second bond site. During this motion, wire anchored at one end to the first bond site pays out wire through the guide bore exit aperture. The tool is then moved downwardly into contact with the second bond site to form a second bond. In this manner, any desired number of pads or other elements of a circuit can be interconnected together, in a procedure referred to as "stitch" bonding.

After the second or last bond in a series of bonds has been made, the wire must be severed, to permit making bonds between other pairs of bond sites. In one method of severing the wire, wire clamp blades are closed upon wire rearward of the bonding tool, and the clamp is translated rearwards from a second bond site to exert tension on the bonding wire sufficient to sever the wire. The clamp is then fed forward to feed a new length of wire from the tool. Alternatively, the wire may be severed by a "table tear" method, in which a table or platform holding a workpiece is translated forward from the tool to tension and thereby sever the wire, while the wire is held by closed clamp blades.

In moving a wedge bonding tool from a first bond site to a second bond site, the tool must be translated rearward from the first site to the second site, in a vertical plane containing both the longitudinal axis and wire-guide bore axis of the tool. This requirement results from the fact that wire paying out forwardly through the exit aperture of the bonding tool tip must remain in the plane containing the longitudinal and guide bore axes of the tool, to ensure that the wire will not bind on the exit aperture chamfer, or become twisted.

Because of the requirement for translating a wedge bonding tool from a first to subsequent bond sites in the plane of the bonding tool longitudinal axis and wire guide bore axis, many existing wedge bonding methods require that a workpiece be rotated to align a direction vector between the two sites with the bonding tool plane, and subsequent translation of the bonding tool rearwardly in that plane along the direction vector.

One method of performing the required relative translations and rotations of a wedge bonding tool relative to a workpiece utilizes a support platform for the workpiece, which is translatable in an X-Y plane perpendicular to the longitudinal axis of the bonding tool, and rotatable in the Y—Y plane. With this method, the bonding tool need only be translatable downwardly, in a minus –Z direction to effect a bond, and upwardly in a plus +Z direction after a bond has been made.

The manufacture of production quantities of microcircuits generally requires the use of automated ultrasonic bonding machines performing bonding operations of the type described above, to achieve satisfactory production rates at reasonable unit costs per circuit. An example of such automated ultrasonic bonding machines is disclosed in the present inventor's application Ser. No. 09/570,196, filed May 12, 2000, for an Automatic Ultrasonic Bonding Machine With Vertically Tiered Orthogonally Translatable Tool Support Platforms, now U.S. Pat. No. 6,382,494. The disclosed machine includes a positioning mechanism for automatically translating the tip of an ultrasonic bonding tool by drive motors to precisely pre-determinable positions within a three-dimensional coordinate space containing a workpiece. The machine described in that application also provides means for translating a bonding tool in X-Y directions parallel to a plane containing a workpiece to position the tool tip over a particular bond site, translating the tool downwardly in a minus –Z direction to make an ultrasonic wire bond, translating the tool upwardly to withdraw the tool tip from the first bond site, and translating the tool in an X-Y direction to position the tip over a subsequent intended bond site, and form thereat a subsequent bond. Thus, the disclosed machine eliminates the a requirement for a rotatable X-Y table for supporting a workpiece, and provides a highly effective method for making bonds on workpieces located on a conveyor, for example.

Operation of automated ultrasonic bonding machines typically requires an operator to select a pre-programmed operation cycle for the machine and arrange for a quantity of workpieces to be automatically presented to the machine, on a conveyor, for example. Pattern recognition logic is then used to position alignment targets of a workpiece precisely with respect to an ultrasonic bonding tool, whereupon a sequence of automatic bonding operations joining individual interconnecting wires between a plurality of first and second bond sites may be initiated. Each work piece may require bonding dozens or even hundreds of individual interconnecting wires between separate pairs of bond sites.

In ultrasonically bonding an interconnecting wire between a pair of first and second bond sites, a length of wire which enters an entrance opening of a wire feed bore through the tool tip from a supply reel or spool and which protrudes from an exit opening of the bore located rearwards of a front foot of the tool is pressed down between the foot of the tool at a first bonding site such as a conductive pad on an integrated circuit chip. Ultrasonic energy is then applied to the tool, causing the tip of the tool to vibrate fore and aft at an ultrasonic frequency. Scrubbing action of the lower surface of the wire against the pad causes the contacting surfaces between the pad and wire to be ground together. This scrubbing action in turn results in the plastic deformation of microscopic surface protrusions, pushing the peaks of the protrusions into valleys of a contacting surface, dispersing impurities from the surfaces and bringing nascent molecules of the wire and pad so close together that they intermingle and form a solid-state diffusion bond. Even though such bonds are formed at room temperature, they are sometimes referred to as welds. The bond or weld secures the wire to the pad mechanically and in electrically conductive contact with each other. The tool tip is moved upwards from the first bond site, and translated rearward from the first bond site to position the tool tip foot over a second bond site, such as a terminal pad. The bonding tool is again moved downwards to press the length of wire against the second conductive pad, and ultrasonic energy once again applied to the tool tip to effect a second bond. Upward motion of the tool tip in conjunction with lateral motion of the tool tip between a pair of bond sites causes wire paid out from the tool between the sites to form an arch-shaped arc, which is longer than the point-to-point distance between bond sites. The arch-shaped length of interconnecting wire between bond sites is provided to avoid electrical contact between the interconnecting wire segment and other portions of a work piece.

After a pair of bonds has been made as described above, a continuous length of bonding wire interconnects the first and second bond sites, and trails rearwardly away from the second bond site under the tool. The trailing portion of wire must be severed by either of two methods, to finish the interconnection and prepare the bonding tool to make another pair of first and second bonds. According to one method of severing a wire at a second bond site, jaws of a wire clamp located behind the tool are closed to grip the wire between the tool and a wire supply reel, and the clamp moved rearward to exert tension on the wire sufficient to break the wire. According to another method of severing a wire at a second bond site, sometimes referred to as a "table tear," a clamp secures the length of wire rearward of the tool, and a platform or table to which a workpiece is secured is translated forward from the tool. In both methods, tension exerted on wire causes it to break at the rear area or heel of the second bond.

After a length of bonding wire from a supply reel has been severed at a second bond site by either of the two methods described above, the wire clamp rearward of the tool is moved forward to feed wire outwardly through the bonding tool bore a distance sufficient to underlie the front foot area of the bonding tool, thus positioning the wire correctly for making a first, source bond at a different bond site.

A problem which can occur using automatic ultrasonic bonding of the type described above is failure of a length of bonding wire to bond to a site. Accordingly, it would be desirable to provide means for detecting failure of a bonding wire to properly bond to a bond site at the time the failure occurs so that a bonding sequence may be halted and corrective action taken.

OBJECTS OF THE INVENTIONS

An object of the present invention is to provide a method and apparatus for detecting faults in the formation of wire bonds made to a bonding site by a wire bonding machine.

Another object of the invention is to provide a method for detecting a failure of wire to bond to the first of a pair of source and destination bond sites which the wire is intended to interconnect, the method utilizing sensing that a length of wire paid out from a bonding tool in traversing a path, typically arc-shaped, between the source and destination bond sites is less than a predetermined arc length, thus indicating that if the wire was not anchored to a first bond site, thereby not paying out from the bonding tool, or not bonding to a bond site intermediate between the source and destination bond sites, thereby causing the length of the interconnecting wire segment to sag and more closely approximate a straight direction vector between the bond sites, rather than an upwardly convex arch-shaped arc length.

Another object of the invention is to provide an apparatus for detecting failure of wire fed through a wire feed bore of an ultrasonic bonding tool to bond to a bond site, the apparatus including an automatic despooler which uses a wire supply spool rotated by a drive motor to product a catenary-shaped length of wire which serves as slack to reduce tension in wire supplied to the tool to a predetermined value, a sensor to detect when the slack has decreased to a predetermined value, thereby straightening the catenary and moving the wire upwardly into the detection range of the sensor, the sensor causing the drive motor to rotate the wire supply spool a predetermined angular increment and thereby feed a predetermined length of wire from the spool to restore the slack length of the catenary, and means for determining that the sensor has been actuated a sufficient number of times during a bonding sequence to pay out a length of wire sufficiently long to indicate formation of arch-shaped, properly bonded interconnections rather than a shorter length of wire indicating failure of wire to bond to a bond site.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends a method and apparatus for detecting faults in ultrasonic wire bonding processes of the type in which fine metal interconnecting wires are ultrasonically bonded to conductive pads on integrated microcircuits, and to other bonding sites such as metal connector terminals. A bond integrity confirmation/fault detection apparatus and method according to the present invention automatically determines whether programmed sequences of wire bond interconnections between pairs of bond sites have been successfully made by an ultrasonic wire bonding machine, and provides an error status signal which provides an alarm indication and is used to halt a sequence of automatic bond formations, upon detecting a failure to form a bond between a wire and a bonding site.

According to the method and apparatus of the present invention, wire is supplied to the entrance opening of a wire feed bore through an ultrasonic bonding tool from a supply spool mounted on an automatic despooler. The function of the despooler is to provide wire to the tool with back tension which is not only small enough to ensure that wire from the supply spool is not stretched or broken as wire is drawn out through an exit opening of the bonding tool bore during the course of making successive interconnecting wire bonds between bond sites, but further that the back tension is sufficiently small to ensure that the shape of wire connections between bond sites, which are typically arcuately curved "arches," will be determined primarily by the path taken by the bonding tool in moving between the bond sites, rather than by back tension in the wire.

The automatic wire despooler utilized in the invention includes a spool drive motor for rotatably supporting a wire supply spool, the drive motor being rotatably driven to advance wire from the supply-spool. The despooler includes an outlet wire-guide eye that has therethrough an aperture through which wire is supplied to a bonding tool support head and through a passageway in the bonding tool support head to the entrance opening of a wire feed bore through the bonding tool.

A length of wire between the supply reel and the despooler outlet guide is allowed sufficient slack for the wire to droop into a modified U-shape or catenary, in response to the weight of the wire combined with a downwardly directed force provided by a stream of flowing air directed downwardly onto the upper, concave surface of the catenary.

A pair of parallel, front and rear hairpin-shaped guide bails located on downstream and upstream sides of the catenary maintain the catenary in a vertical plane adjacent to a proximity sensor positioned between the guide bails.

The proximity sensor has a sensitive axis directed perpendicularly outwards through the plane of the catenary and produces an electrical output signal when tension is exerted on the bonding wire downstream from the front hairpin guide which is sufficient to straighten the catenary so that a central part or vertex thereof is elevated to a location adjacent to the proximity sensor, which then outputs an electrical detection signal. The detection signal is input to control logic circuitry, which in turn outputs a drive signal to the despooler motor which is effective in rotating the motor shaft and spool a predetermined angular increment, thus paying out a predetermined length of wire from the supply spool, and thereby increasing the slack length between the guide bails to a value which causes the catenary to droop to a predetermined shape and out of the detection range of the proximity sensor.

The act of paying out wire between successive bonds of a connection sequence draws wire from the un-sensed catenary position up into the detection range of the proximity sensor; the sensor then outputs a signal which causes electrical power to be supplied to the despooler motor for a period sufficient to rotate a predetermined angular increment, thereby feeding a length of wire from the wire supply spool sufficient to re-form the catenary. Each run of the despooler motor causes an electronic set signal to be applied to an input terminal of a latch such as a flip-flop or other memory element. The minimum length of wire advanced by incremental rotation of the despooler motor is less than the length of wire required to make a typical bond interconnection between a pair of bond sites, i.e., approximately 0.030 inch. Thus, bonding an interconnecting wire segment between a pair of bond sites typically requires that a wire length drawn through the bonding tool be longer than the minimum length of wire advanced by the despooler. Therefore, according to the invention, a control logic sequence, preferably within a microprocessor which controls operation of the ultrasonic bonding machine, interrogates the despooler motor drive latch after one or more bond pair interconnections have been made, to confirm that the despooler motor has been actuated a sufficient number of times to thereby feed a minimum length of wire to the bonding tool, indicating successful bond formation. Absence of a motor drive latch signal indicates a bond failure for all connections of normal or longer length. Very short connections are known from their coordinates and are accumulated to a length equal to or greater than a minimum before requiring the absence of a motor-run drive latch signal to indicate a bond fault. Desirably, the apparatus according to the present invention is capable of detecting a particularly troublesome bond failure which occurs when a bonding wire does not successfully bond to a first bond site of a pair of bond sites, but remains under the tool foot. In a case such as this where a wire has been scrubbed against the surface of a bonding site without successfully bonding to the site, material properties of the wire are altered such that the wire can never be properly bonded, and moreover will destroy subsequent bond sites or targets if bonding attempts were continued.

BRIEF DESCRIPTION OF THE DRAWINGS

FIG. 8 is a fragmentary elevation, on a substantially enlarged scale, of a lower portion of a bonding tool used in the apparatus of FIG. 1.

FIG. 9C illustrates the manner of severing a wire after the wire has been bonded to the last bond site in a sequence.

FIG. 9D is a view similar to that of FIG. 8B, but showing the effect of translating the tool from a site to which a wire was not correctly bonded.

FIG. 10A is a diagrammatic view showing a fault-free sequence of bonding operations.

FIG. 10B is a diagrammatic view showing a first type faulty bond sequence.

FIG. 10C is a diagrammatic view showing a second type faulty bond sequence.

DESCRIPTION OF THE PREFERRED EMBODIMENTS

Figure 1:
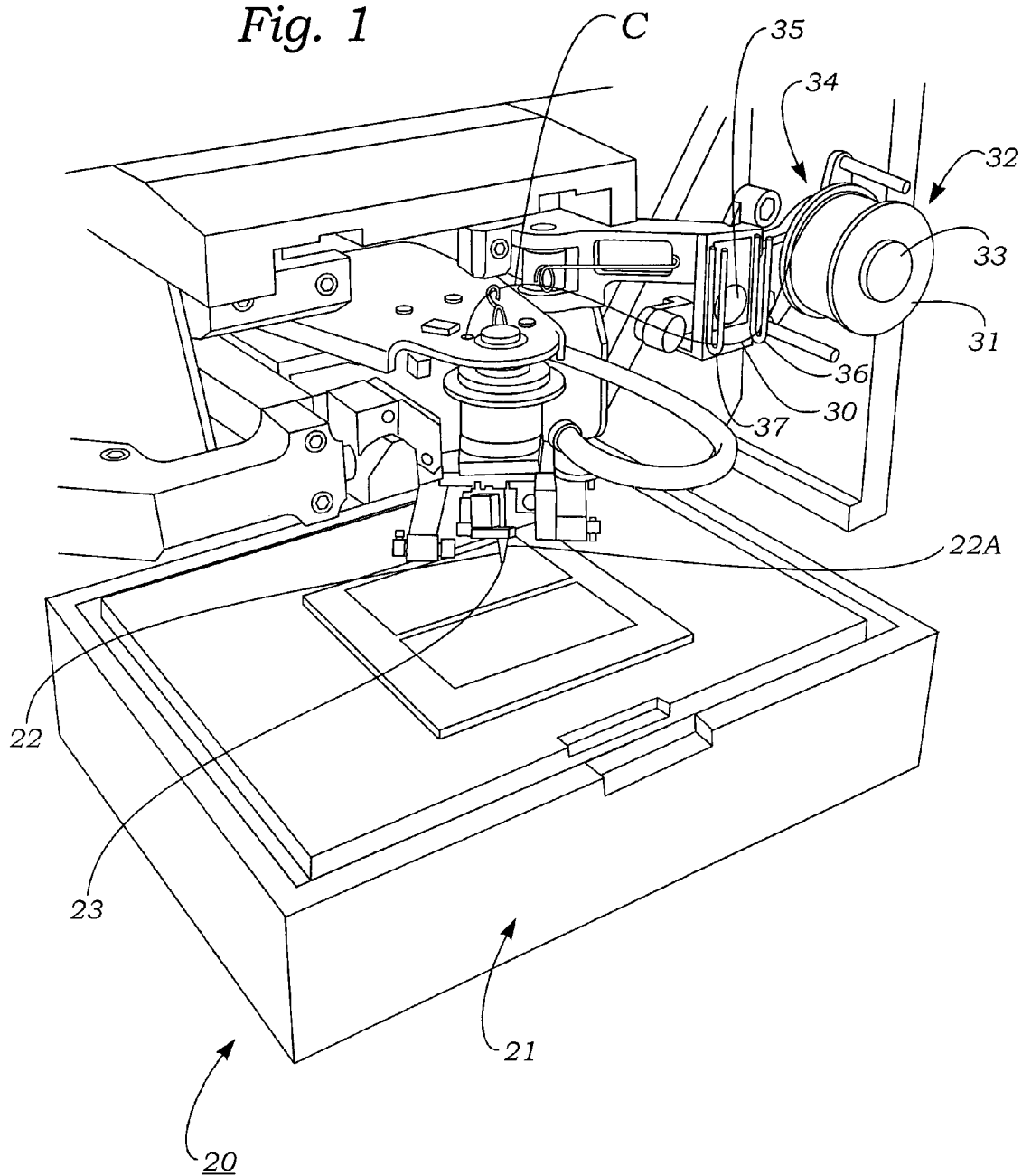
FIG. 1 is a front perspective view of an ultrasonic bonding machine on which is mounted a wire despooler/bond fault detection apparatus according to the present invention.

FIGS. 1–10C illustrate various aspects of a wire bond fault detection method and apparatus according to the present invention.

Referring first to FIGS. 1–4, a wire bond fault detection apparatus 20 according to the present invention is shown mechanically attached to an ultrasonic bonding machine 21, which it operates integrally with. As shown in FIG. 8, bonding machine 21 includes a bonding tool 22 which has an upper, generally cylindrically-shaped shank 22A and a lower, pointed end 23 which has disposed therethrough a wire feed bore 24 that has an upper entrance opening 25 and lower exit opening 26. Bonding wire C is drawn out of exit bore opening 26 and positioned below a foot 27 of tool tip 23, whereupon the tool is translated downwardly towards a workpiece A to press a length of wire C below the foot against a first bond site B1 on the workpiece. Ultrasonic energy is then applied to the upper, shank end 22A of tool 22, thus causing foot 27 and wire C to execute a horizontal scrubbing motion oscillating at an ultrasonic frequency, on wire C and bond site B1 and thereby causing an intermmetallic diffusion bond or "weld" to be made between the wire and the bond site. Tool 22 is then moved upwardly away from bond site B1, and machine 21 and/or a table T supporting workpiece A are then translated horizontally with respect to one another to position tool tip foot 27 above another bond site, such as a second bond site B2. Machine 21 then moves tool tip 27 vertically downwards to thereby press a length of wire, paid out through bore exit opening 26 of bonding tool 22, in moving between bond sites, against second bond site B2, and the tool once again ultrasonically energized to thereby make a second bond.

Figures 9A, 9B:
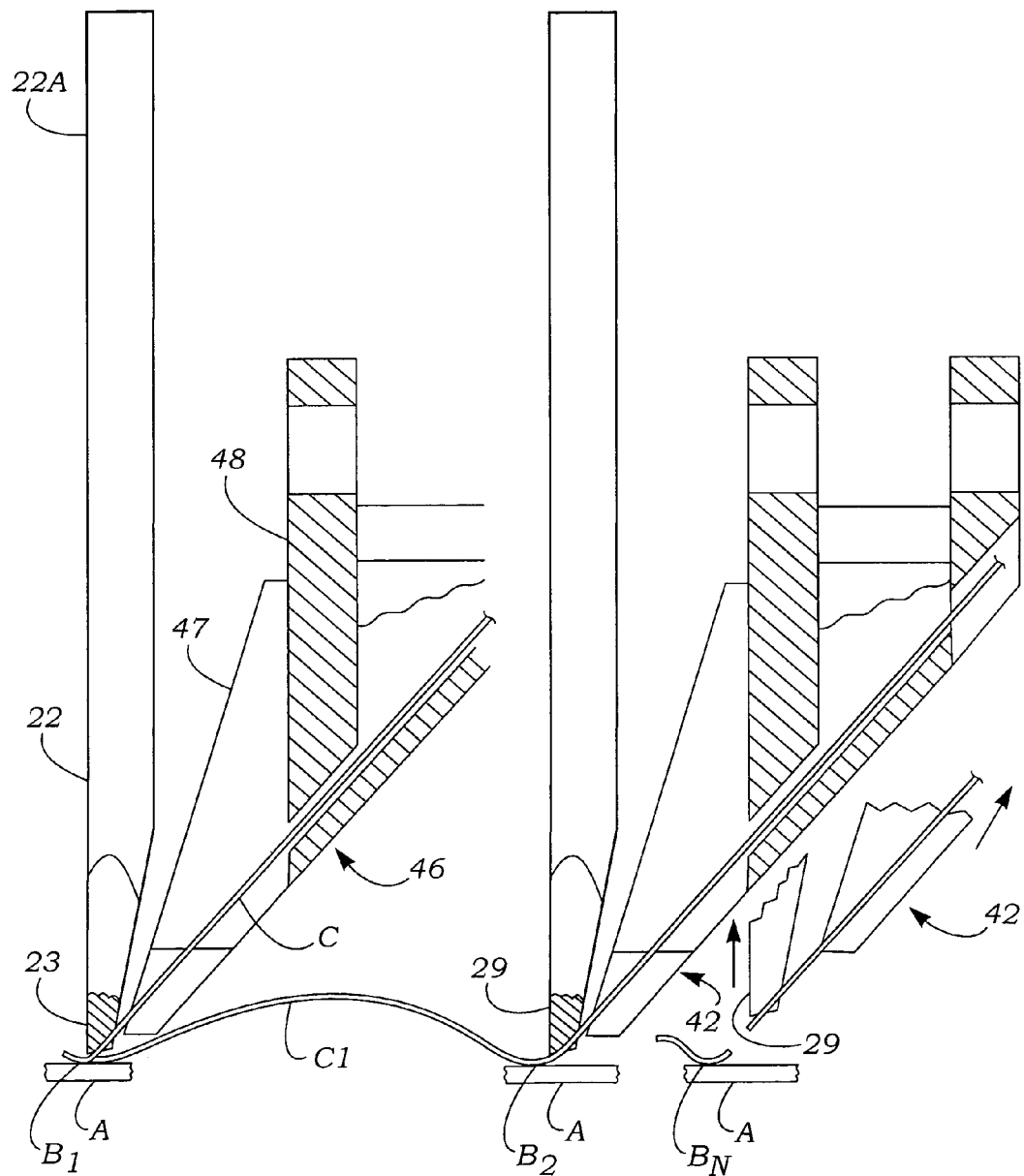
FIG. 9A is a fragmentary view of the apparatus of FIG. 1, on an enlarged scale, showing a bonding tool thereof making the first of a series of wire bonds at a first bond site.
FIG. 9B is a view similar to that of FIG. 8A, showing a subsequent bond being made at a subsequent bond site.

The combined vertical and horizontal motions of tool tip 27 in moving from a first bond site B1 to a second bond site B2 causes a predetermined length C1 of wire C to be drawn through bore 26 of tool 22, forming an arch-shaped interconnecting wire segment C1 if the wire is successfully bonded to the first bond site, as shown in FIGS. 9A and 9B. However, if wire A does not successfully bond to a first bond site B1, wire C is not pulled from exit opening 26 of bonding tool bore 24, as shown in FIG. 10C, thus resulting in less than a predetermined length of wire.

Figure 2:
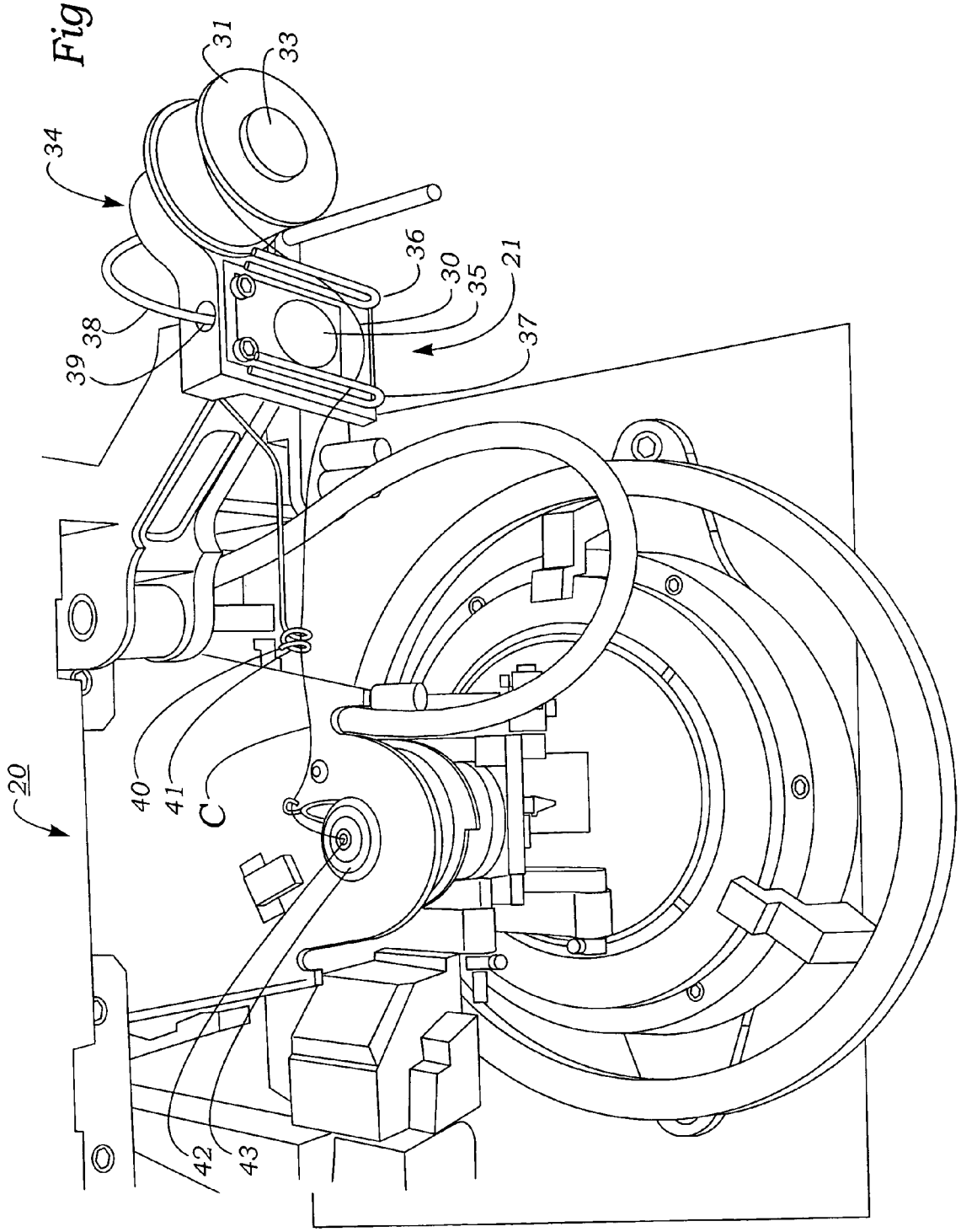
FIG. 2 is a fragmentary upper front perspective view of the apparatus of FIG. 1, on an enlarged scale.
Figure 3:
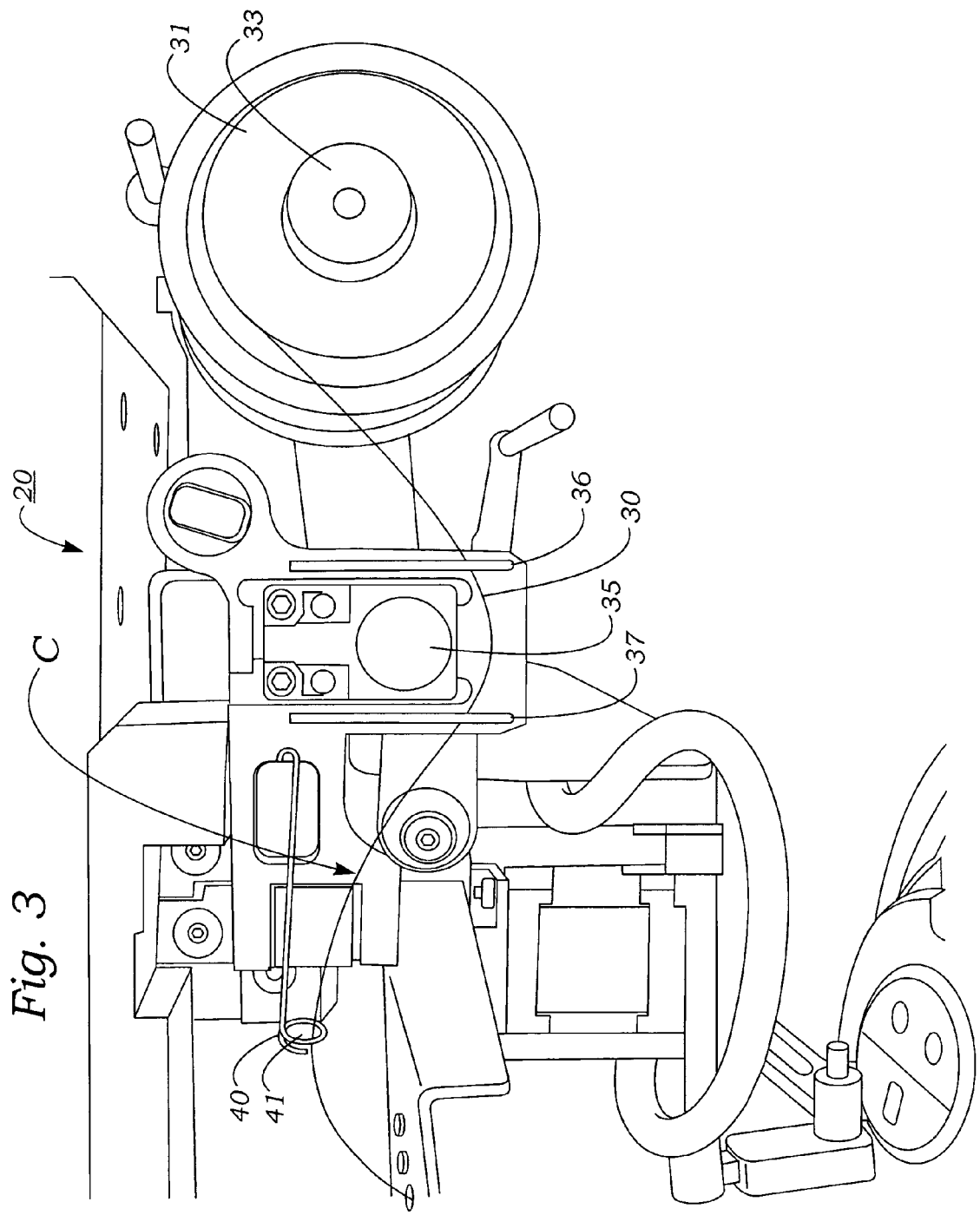
FIG. 3 is a fragmentary front elevation view of the apparatus of FIG. 2, on a further enlarged scale.
Figure 4:
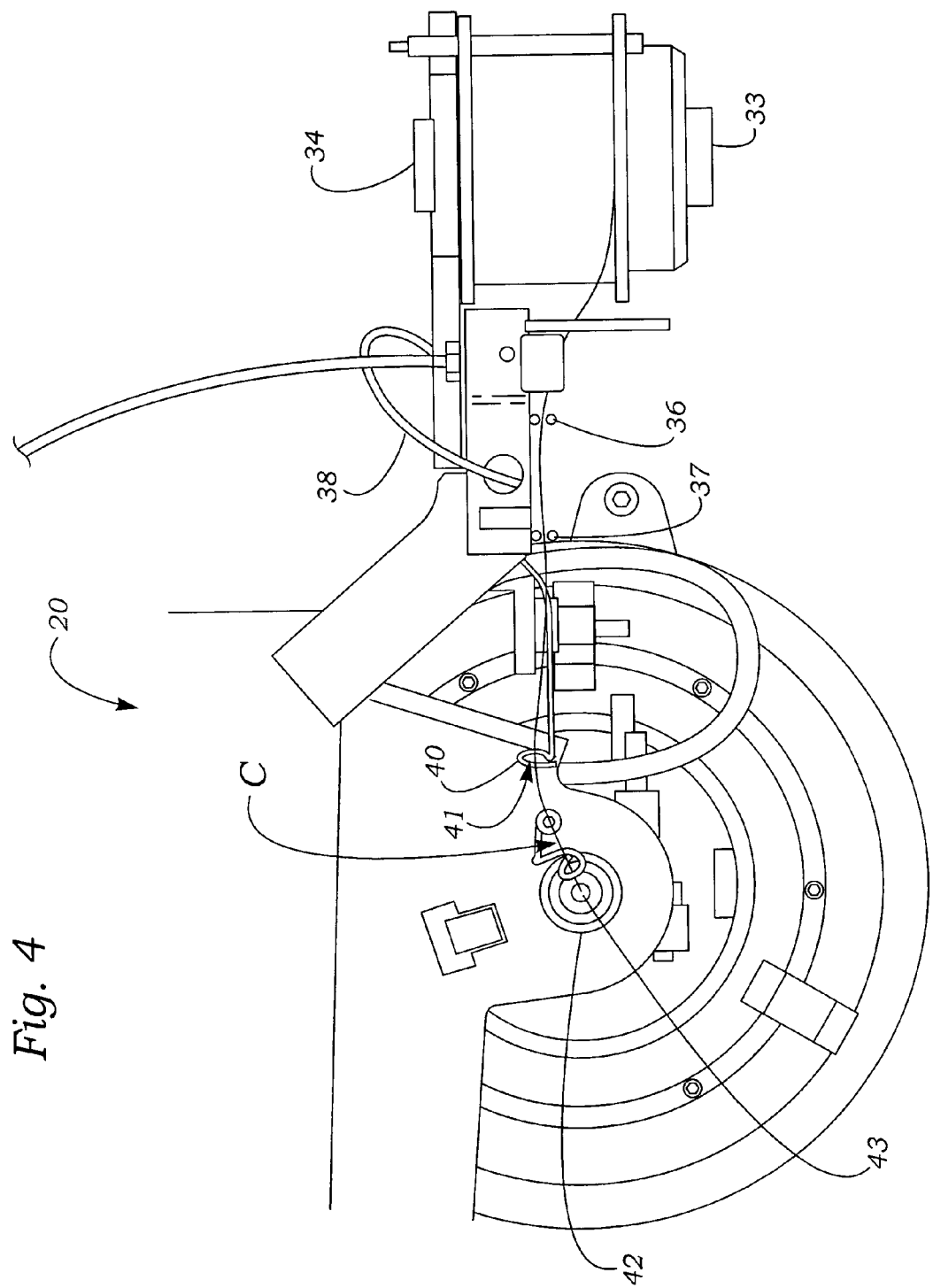
FIG. 4 is an upper plan view of the apparatus of FIG. 2.

Referring to FIGS. 1–4, spool 31 is mounted on the shaft 33 of motor 34, which is energized to rotate the motor shaft a predetermined angular increment to thereby pay out a predetermined length of wire F, whenever tension in wire C downstream from the spool 31 causes the slack length to decrease and thereby elevate the vertex of the catenary 30 into the detection range of a proximity sensor 35, which then outputs a detection signal D'. As shown in FIG. 2, sensor 35 is located between a pair of inlet and outlet, hairpin-shaped wire guide bails 36, 37. The downwardly drooping, upwardly concave shape of catenary 30 between inlet and outlet bails 36, 37 is maintained by the combined effects of gravity acting on the wire, and a stream of compressed air supplied through a hose 38 to a nozzle 39 which directs the air stream onto the upper concave surface of the catenary. As is also shown in FIG. 2, wire C from outlet bail 37 passes through the aperture 41 of wire guide 40, downwardly through an orifice 42 in a bonding tool support head 43 of bonding machine 21, and thence into entrance opening 25 of bonding tool wire feed bore 24. Referring to FIGS. 9A–9C, it may be seen that ultrasonic bonding machine 21 preferably includes a wire clamp 46 which has front and rear clamp blades 47, 48, which are spring biased together to exert a clamping force on a length of wire C passing through an angled bore 49 through the clamp. Functions of wire clamp 46 are described below after the following description of operation of automatic wire despooler 32.

Wire despooler 32 of wire bond fault detection apparatus 20 according to the present invention operates generally in a similar fashion to the automatic wire despooler described in U.S. Pat. No. 5,318,234, owned by the assignee of the present invention. Therefore, for the sake of brevity in describing functions of despooler 32 of the present invention, the entire disclosure of U.S. Pat. No. 5,318,234 is hereby incorporated by reference into the present specification.

Figure 5:
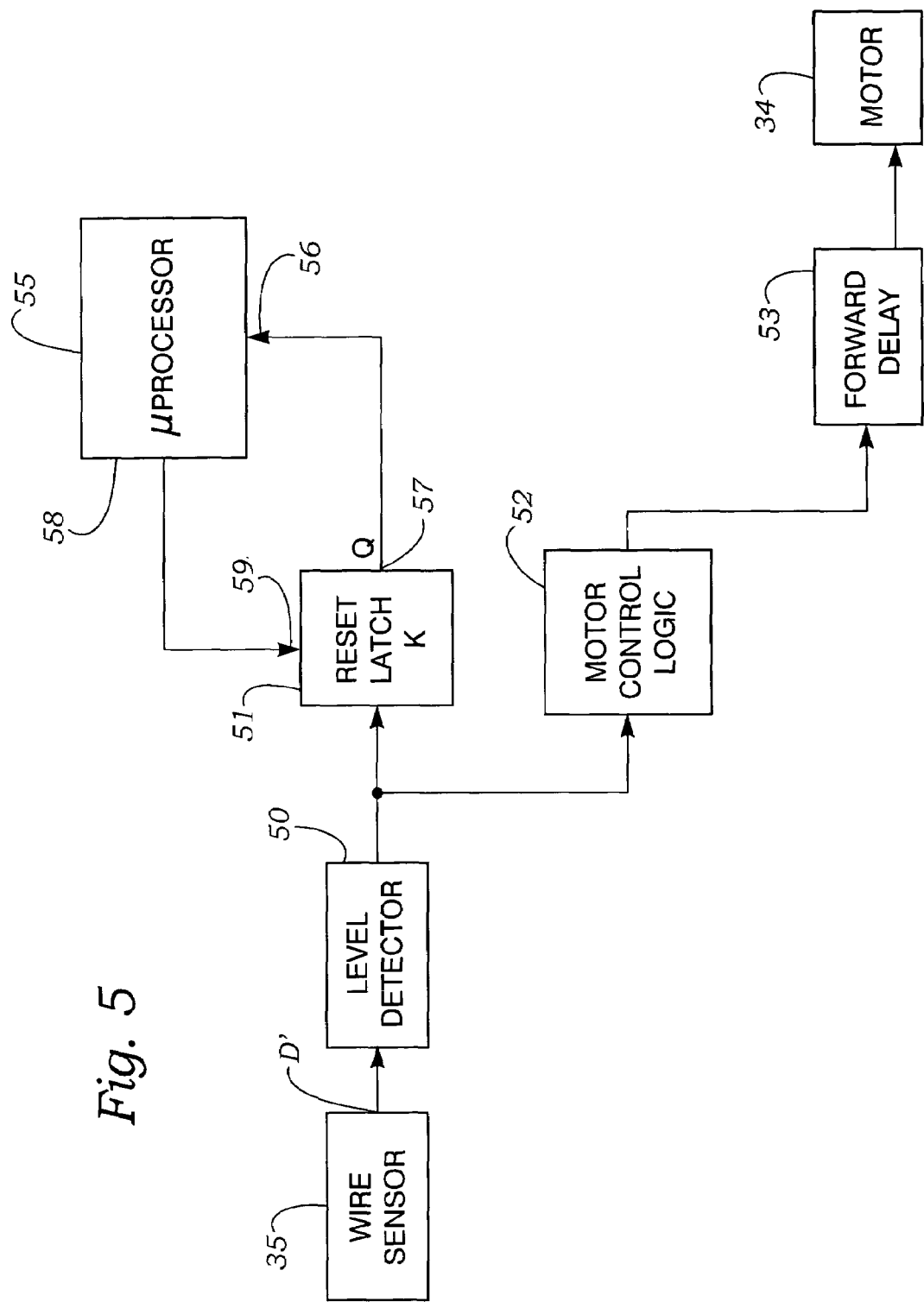
FIG. 5 is a block diagram of electronic switching and detection components of a despooler component of the apparatus of FIG. 1.
Figure 6A:
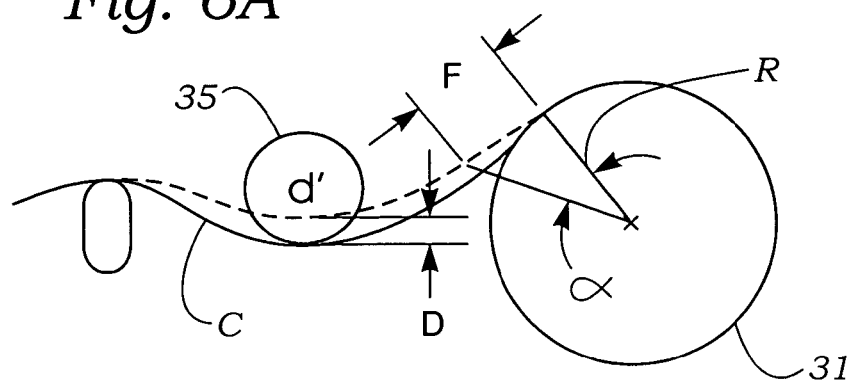
FIG. 6A s a diagrammatic view showing operation of a wire supply despooler utilized in the apparatus of FIG. 1.

Referring to FIGS. 5 and 6A in addition to FIGS. 1–4, tension in wire C raised by drawing wire from exit opening 26 of tool tip 23 as a result of bonding an end of the wire to a first bond site B1, as shown in FIG. 9A, and subsequently translating the bonding tool to a second bond site B2, as shown in FIG. 9B, causes catenary segment 30 of wire C to shorten, straighten and elevate. When catenary 30 has shortened, straightened and thereby elevated into the detection range of proximity sensor 35, as shown by the dashed line in FIG. 6, sensor 35 outputs an electrical detection signal D' to an electronic level detector such as a Schmitt trigger 50. When wire is within the detection range of proximity sensor 35, a detection signal output D from the sensor which exceeds the input transition threshold of level sensor 50, causes the level sensor to output an electronic logic level signal to a "K" memory latch 51 and motor control logic 52. Motor control logic 52 in turn outputs a drive signal to motor drive relay 53, thereby energizing motor 34 for a predetermined period which causes motor shaft 33 and spool 31 to rotate a predetermined angular increment $\propto$.

As shown in FIG. 6A, rotation of spool 31 having a radius R by an angular increment $\propto$ causes a length $F = \propto R$ of wire to be fed or paid out from the spool, which length restores catenary 30 to the length showing in sold lines in FIG. 6A, thereby lowering the catenary below the detection range of proximity sensor 35, and thus causing the output voltage level of the sensor to return to a quiescent, logic zero state signifying absence of wire from the detection range of the sensor.

As shown in FIG. 5, wire bond fault detection apparatus 20 includes control and decision circuitry which is preferably implemented within a microprocessor 55 which controls wire bonding operations of ultrasonic bonding machine 20. As shown in FIG. 5, microprocessor 55 has an interrupt input port 56 which is connected to a Q or SET output port 57 of memory latch 51, and an output port 58 which is connected to a RESET input port 59 of the memory latch. As will be explained in detail below, a wire bond fault detection method employing apparatus 21 includes the steps of interrogating the status of output port 57 of memory latch 51 via interrupt input port 56 of microprocessor 55 at appropriate times, and subsequently resetting the latch to a logic zero output state via a RESET signal output from output port 58 of microprocessor 55 to RESET input port 59 of the memory latch. If Q output port 57 of memory latch 51 has been set to a logic true state prior to interrogation by interrupt port 56 of microprocessor 55, indication is given that motor 34 has been previously energized to thereby rotate spool 31 and pay out wire C from the spool. Thus, memory latch 51 may be referred to as a "motor-run" latch.

Figure 7A:
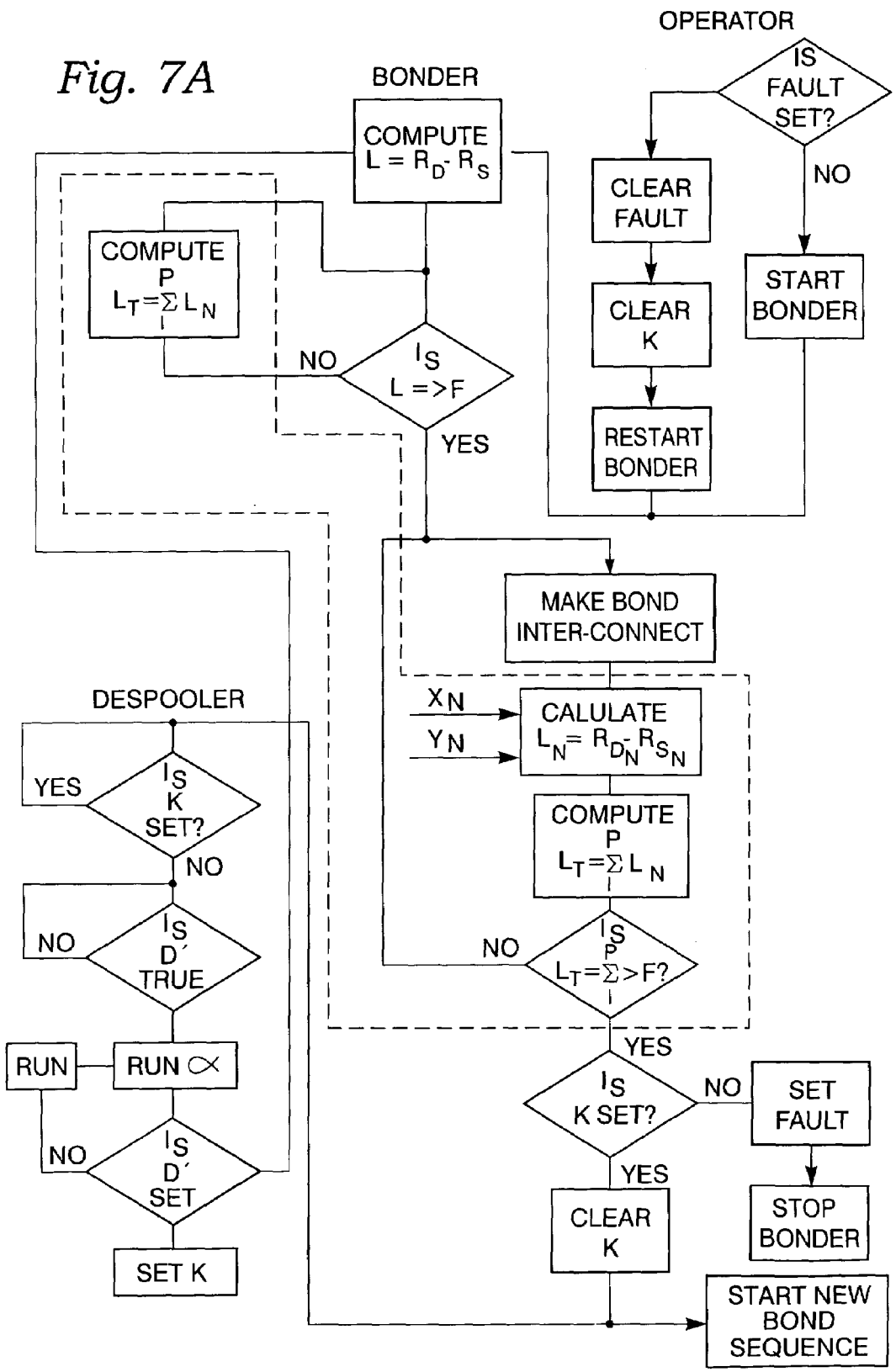
FIG. 7A is a flow chart illustrating a first type operational bond fault detection sequence of the invention for individual interconnection bonds in which the length of interconnecting wire is of a conventional size, and for a sequence of short bonds.
Figure 7B:
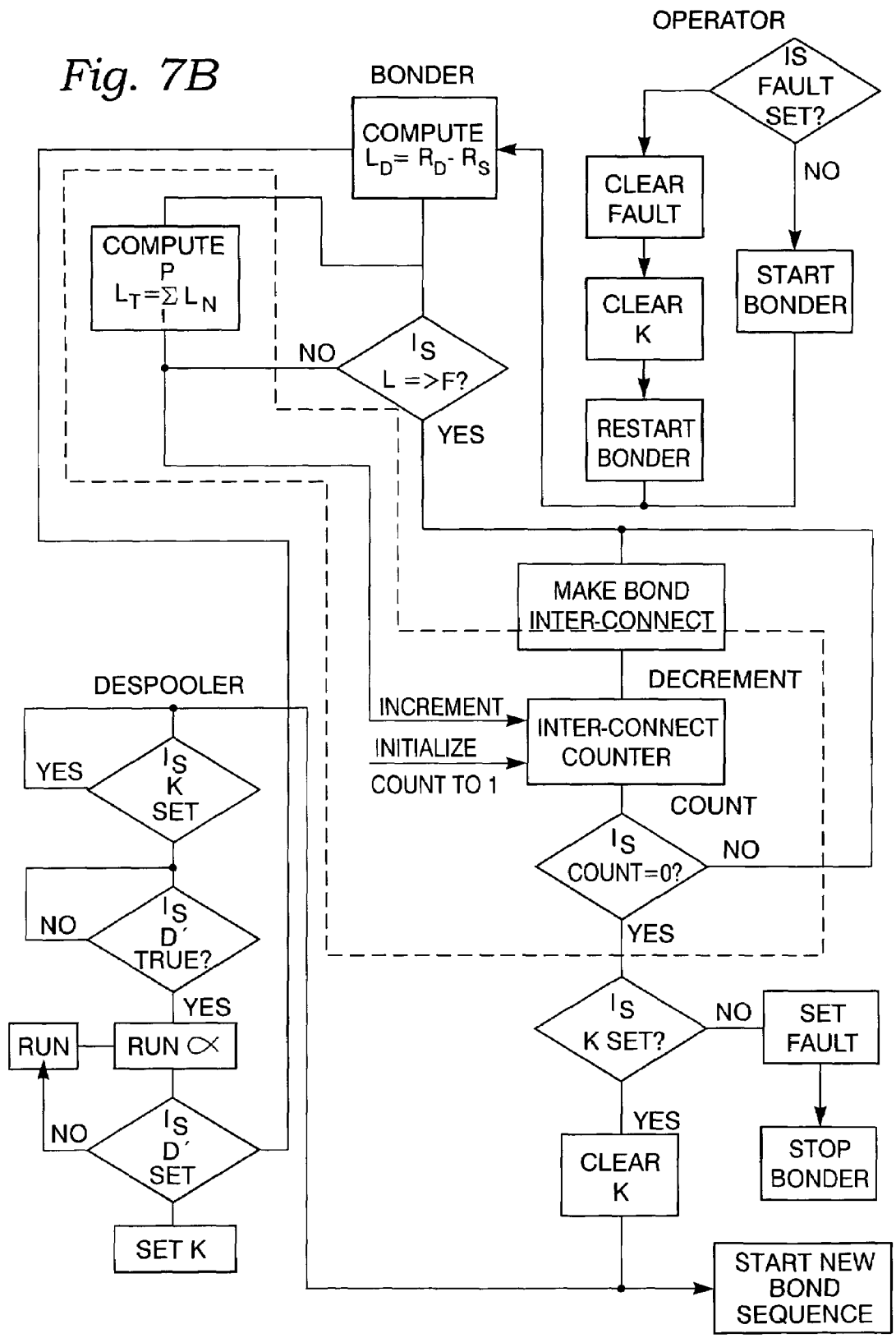
FIG. 7B is a flow chart illustrating a second operational bond fault detection sequence of the invention.

FIGS. 7A and 7B illustrate two variations of a method for detecting wire bond faults according to the present invention.

As shown in FIGS. 7A and 7B, an automatic sequence of bonding an interconnecting wire to a pair of bond sites BS (source) and BD (destination) of a workpiece first entails checking by a human operator to determine if bonding machine 21 is suitably configured to begin a bonding sequence, as shown in the right-hand column labeled OPERATOR in FIGS. 7A, 7B. The operator performs any required initialization steps, such as clearing a fault, e.g., re-threading bonding wire from a supply reel into the bore of a bonding tool, etc., and then initiates a START BONDER command. Each interconnection between a pair of bond sites in a bonding sequence requires that X-Y coordinates of each bond site be known in advance. Accordingly, the length of a wire which is to interconnect a pair of bond sites is calculated as:

$$|L|=\beta|R_D-R_S| \qquad \text{(eqn. 1)}$$

where $R_D$ is a positive vector from the origin of an X-Y coordinate space to a destination bonding site $B_D$, $R_S$ is a positive vector from the origin to a source bond site $B_S$, and β is a constant. Usually, β has a value greater than one, thus accounting for the fact that the tool tip path and a properly formed wire segment which interconnects a pair of bond sites is arch-shaped rather than a straight, point-to-point vector. However, in certain bonding applications, e.g., where a straight, point-to-point interconnection is made between a pair of bond sites, β could have a value of one, or simply be eliminated from equation 1.

Figure 6B:
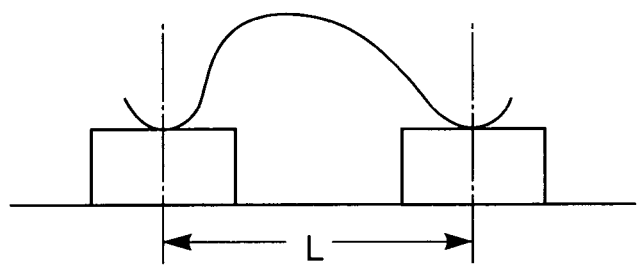
FIG. 6B is a diagrammatic view showing a bonding wire segment of a length greater than the slack length D of FIG. 6A.

As shown in FIG. 6B and the center column of FIGS. 7A and 7B, labeled BONDER, if the calculated length L of a wire segment between a pair of bond sites $B_S$, $B_D$ is greater than the vertical slack length D, which is equal to the run length F of wire fed from despooler spool 31 in response to shortening the catenary by that length, a first bond connection is made at the source site $B_S$, as shown in FIG. 9A. Then, as shown in FIG. 9B, tool 22 is moved in an arch-shaped path to the second bond site $B_D$, whereupon a second bond is made. If wire C is successfully bonded to the first bond site, $B_S$, a length of wire segment $C_i$ which interconnects the two bond sites is equal to or greater than despooler wire feed length F which is drawn from tool 22 in moving the tool between bond sites $B_S$, $B_D$, thus causing sensor 35 and motor-run latch K (51) to be set. Therefore, as shown in FIG. 7A, motor-run latch K is in a logic TRUE state, when interrogated by microprocessor 55 after a successful bond interconnection has been made. Thus, a PASS flag internal to the microprocessor is set signifying a successful completion of one or more bond site interconnections in a sequence. The presence of a PASS flag causes the microprocessor to reset motor-run memory K latch 51, and reinitiate a new bond interconnection sequence in a pre-programmed set of such sequences. However, as shown in FIGS. 7A and 7B, if memory latch K is not in the SET, logic TRUE state when tested after completion of a bond sequence, a FAULT flag is set, halting automatic operation of the bonding machine until the bond failure is identified and corrected.

Figure 6C:
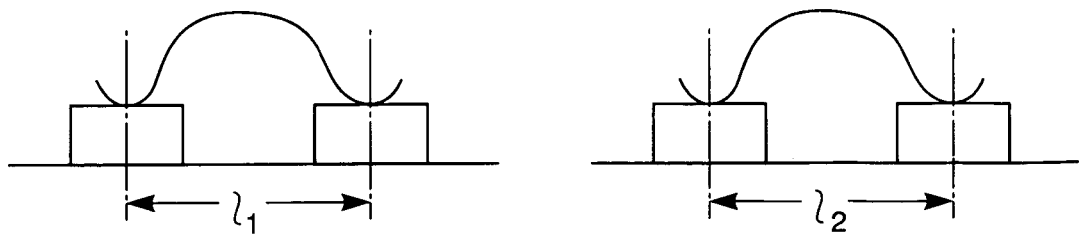
FIG. 6C is a diagrammatic view showing bonding wire segments having lengths less than slack length D.

As shown in FIGS. 6C and 10A, the length of a wire segment $L_i$ which interconnects a pair of bond sites which are quite close to one another is less than distance D required to actuate proximity sensor 35. In that case, the operational sequence depicted in FIGS. 7A and 7B and described above would give a false fault indication. Therefore, the operational sequence of the wire bond fault detection method according to the present invention preferably includes a sub-routine which correctly ascertains whether or not a sequence of two or more short interconnections are successfully performed between two or more pairs of closely spaced bond sites. Two somewhat different sub-routines used for testing short bond interconnections are indicated by the blocks enclosed by dashed lines in FIGS. 7A and 7B.

Turning first to FIG. 7A a sub-routine for confirming that a sequence of two or more interconnections between two or more pairs of bond sites has been successfully made, and setting a fault flag indication if a bond failure is detected, may be seen to include the first step of computing the length $L_1$ of a properly arched wire segment which is to interconnect a first pair of bond sites $BS_1$ and $BD_1$, according to equation (1). If $L_1 \geq F$, then a bond interconnection and bond fault detection are performed as described above, with reference to the steps not enclosed by dashed lines in FIGS. 7A and 7B. However, if $L_1<F$ then the sum of the length of a sequence of interconnections is calculated according to the formula:

$$L_t=\Sigma_1^P \beta l_n = \Sigma^P |RD_n - RS_n| \qquad \text{(eqn. 2)}$$

where $L_t$ is the total length of an integer number p of individual interconnection wire segment lengths $l_n$, and P, $Rd_n$, $Rs_n$ are defined following equation (1) above. As shown in dashed lines in FIG. 7A, the sum $L_t$ is computed for P bonds until $L_t>F$, whereupon a bonding sequence is initiated. The coordinates $RS_n$ of the source bond site $BS_n$ are subtracted from the coordinates $RD_n$ of the destination bond site $B_{dn}$ for each interconnection to be made between a pair of bond sites. When the sum $L_t$ of the lengths $l_n$ of wire segments of correctly made interconnection bonds is equal to or greater than wire despooler feed length F, motor-run K latch 51 is checked to confirm that the K latch has been set, and the remaining steps of bond fault detection are performed in the exact same manner as that for conventional bonds of individual length greater than F, as described above.

FIG. 7B illustrates a variation of the method of FIG. 7A described above. In the method of FIG. 7B, the length of a first properly formed interconnection wire segment $l_1$ between a first pair of source and destination bond sites BS, BD is calculated for a sequence of bond site interconnections. If $l_1<F$, the length of a second segment 12, is calculated, and added to $l_1$. A sequence of lengths $l_1$, $l_2$, $l_3$ ... lp is summed for P times until the sum is greater than F. A sequence of P bond site pair interconnections is then made. Motor-run K latch 51 is then checked to confirm that it has been set, and the remaining steps of bond fault detection are performed in the exact same manner as described above for conventional single bond interconnections of length greater than F'.

FIGS. 10A–10C illustrate in a diagrammatic way various sequences of ultrasonically formed wire bond interconnections monitored by the method and apparatus according to the present invention. In each of FIGS. 10A–10C, a particular example is shown of a bonding sequence in which four individual wire interconnections are made between four different pairs of source and destination bonds sites $BS_n$, $BD_n$. However, the following analysis is also applicable to either a single interconnection between a pair of bond sites for which the calculated wire segment length is equal to or greater than the minimum run length F of despooler 32, and also for two or more interconnections between two or more pairs of bond sites for which each individual interconnection wire segment has a calculated length less than F.

Referring first to FIG. 10A, a fault-free bond sequence is shown in which the total length $L_t$ of wire drawn from a wire supply is equal to or greater than F', thus causing despooler 10 motor K latch 51 to be set, thereby indicating a fault-free bonding sequence.

FIG. 10B illustrates a bond sequence in which a wire segment fails to bond to a source and/or destination bond site of the second in a sequence of four interconnections. In that case, bonding tool 22 draws a length of wire less than F from a wire supply, thereby failing to set motor-run latch 51, and thereby causing a fault indication.

FIG. 10C illustrates a bond sequence in which either a wire segment fails to bond to a first bond site $BS_1$, thus not drawing a wire length $l_1$, breaks between another source and destination bond site pair $BS_4$, $BD_4$, or experiences both types of failures. Either of the two aforementioned faults results in a wire length less than F being drawn through tool 22, thereby causing a fault indication.

From the foregoing examples, it is clear that a wire bond fault detector method and apparatus according to the present invention provides a versatile means for detecting various types of wire bond faults which can occur during operation of an ultrasonic wire bonding machine. In particular, the invention provides means for detecting failure of an interconnecting wire to successfully bond to a first or subsequent bond site in a sequence of bond interconnections made between pairs of source and destination bond sites which are spaced apart at conventional distances greater than the minimum despooling length of an automatic wire despooler used to supply wire to a bonding tool, or between two or more pairs of bond sites in which the source and destination bond sites are spaced apart at a distance less than the minimum wire despooler length. Moreover, the method and apparatus according to the present invention provides a fault indication if a wire breaks between a pair of bond sites.

What is claimed is:

1. An apparatus for detecting failure of wire fed through a wire feed bore in an ultrasonic bonding tool of an ultrasonic bonding machine to properly bond to a bond site, said apparatus comprising;
   a. wire feed means including a despooler for feeding bonding wire to an inlet aperture of a wire feed bore through an ultrasonic bonding tool, said despooler comprising:
      i. wire supply spool means,
      ii. drive motor means for rotatably supporting said wire supply spool means,
      iii. outlet wire guide eye means which has therethrough an aperture through which wire from said wire supply spool means is supplied to said entrance opening of said wire feed bore through said bonding tool,
      iv. means for forming a slack portion of wire of predetermined slack length F between said wire supply spool means and said outlet wire guide eye means,
      v. wire sensor means for providing a detection signal when the length of said slack portion of wire is shortened by a predetermined amount in response to wire being drawn from an outlet aperture of said wire feed bore of said bonding tool, and
      vi. motor actuator means responsive to said sensor detection signal in rotating said wire supply spool drive motor means a predetermined angular increment to thereby pay out wire from said wire supply spool means in a forward direction towards said outlet wire guide eye means, thereby restoring said slack portion of wire to said predetermined length F,
   b. monitoring means for monitoring the length of wire fed by said wire feed means to said bonding tool,
   c. distance determining means for determining a direction vector distance R between a pair of bond sites comprising a source bond site BS and a destination bond site BD on a workpiece,
   d. logic means for confirming that a length of wire C drawn from said wire feed supply spool means by said bonding tool in forming a wire interconnection bonded at a source end of said wire to said source bond site and at a destination end of said wire to said destination bond site is at least as large as a length L which is at least as large as said vector distance R between said bond sites, and
   e. said logic means outputting a first, pass signal if C is at least as large as L, and a fail signal if C is less than L.

2. The apparatus of claim 1 further including calculating means for multiplying said direction vector distance R by a constant β to thereby calculate said length L of an arched wire segment between said bond sites.

3. The apparatus of claim 1 wherein said wire sensor means is further defined as being a proximity sensor.

4. The apparatus of claim 1 wherein said logic means for confirming that said length of wire C from said wire supply spool means in forming a wire interconnection between said pair of bond sites is at least as long as said length L of wire required for an interconnecting wire segment between a pair of bond sites, where L is at least as long as said slack length F, comprises;
   a. motor-run memory latch means set by said wire sensor detection signal,
   b. monitor means for monitoring an output state of said latch after completing a bonding sequence for forming a wire interconnection between at least one pair of bond sites,
   c. means for providing a pass indication signal if said output state of said latch indicates that said latch has been set, and a fault indication signal if said latch has not been set, and
   d. means for resetting said latch.

5. The apparatus of claim 4 further including;
   a. means for determining whether a calculated length $L_1$ of a wire for interconnecting a first pair of bond sites $BS_1$, $BD_1$, is equal to or greater than said slack length F,
   b. means for adding to $L_1$ the lengths of a sequence P-1 of additional calculated bond wire lengths $L_2$ through $L_n$ if $L_1$ is less than F until the total calculated length $L_t$ of P bond interconnection wire segments is at least as long as said slack length F,
   c. means for initiating a sequence of P pairs of bonding machine actuations to make P pairs of interconnecting bonds after having performed said addition,
   d. means for determining that P pairs of bonding machine actuations have been made, and
   e. means for initiating monitoring of said output state of said motor-run latch after completion of P pairs of bonding machine actuations.

6. The apparatus of claim 5 wherein said means for determining that said number of actuations of said bonding machine required to make P pairs of bonds between P pairs of bonding sites have been made is further defined as comprising monitoring of the motion of said bonding tool tip and summing the lengths of direction vector movements between each of said P pairs of bond sites, and outputting a test signal for monitoring an output state of said motor-run memory latch when said sum of direction vector lengths is at least as large as said total calculated length $L_t$ of P bond interconnection wire segments.

7. The apparatus of claim 5 wherein said means for determining that said P pairs of bonding machine actuations between P pairs of bond sites has been completed is further defined as comprising means for changing an accumulated count by one count for each said pair of bonding machine actuations, and outputting a test signal for monitoring an output state of said motor-run memory latch when said count changes by P counts.

8. The apparatus of claim 5 further including calculating means for multiplying said direction vector distance R by a constant β to thereby calculate said length L of an arched wire segment between said bond sites.

9. An apparatus for detecting failure of wire fed through a wire feed bore in an ultrasonic bonding tool of an ultrasonic bonding machine to properly bond to a bond site, said apparatus comprising;
　a. an automatic wire despooler for supplying wire from a wire supply spool to an inlet aperture of a wire feed bore in an ultrasonic bonding tool, said despooler providing a slack portion of wire between said spool and said tool to thereby ensure that the shape of interconnecting wire arches made between pairs of bond sites on a workpiece is determined by a path taken by a tip of said bonding tool in moving between a pair of first and second bond sites, thereby drawing wire from an outlet aperture of said wire feed bore with back tension minimized by presence of said slack portion, said despooler comprising;
　　(I) drive motor means for rotating said spool by a predetermined angular increment upon energizing said drive motor for a predetermined time period,
　　(ii) outlet wire guide eye means having therethrough an aperture through which wire is supplied from said despooler to said bonding tool,
　　(iii) means for maintaining said slack portion of wire in a drooped, catenary shape,
　　(iv) wire sensor means located between said spool and said outlet wire guide eye means, and above said catenary, said sensor outputting a wire detection signal when said catenary is shortened to thereby elevate its vertex into detection range of said sensor,
　　(v) motor drive means responsive to said wire detection signal in energizing said drive motor means to thereby rotate said spool a predetermined angular increment and thereby restore said shape of said catenary and restore said slack portion of said wire to a predetermined length F,
　b. monitoring means for monitoring the length of wire supplied by said despooler to said bonding tool,
　c. distance determining means for determining a direction vector distance R between a pair of bond sites comprising a source bond site BS and a destination bond site BD on a workpiece,
　d. logic means for confirming that a length of wire C drawn from said despooler by said bonding tool in forming a wire interconnection bonded at a first portion of said wire to said source bond site and at a second portion of said wire to said destination bond site is at least as long as a length L which is at least as large as said vector distance R between said bond sites, and
　e. said logic means outputting a first, pass signal if C is at least as long as L, and a fail signal if C is less than L.

10. The apparatus of claim 9 further including calculating means for multiplying said direction vector distance R by a constant β to thereby calculate said length L of a properly arched wire segment between said bond sites.

11. The apparatus of claim 9 wherein said wire sensor means is further defined as being a proximity sensor.

12. The apparatus of claim 9 wherein said logic means for confirming that a length of wire C supplied by said despooler to said bonding tool is at least as long as said calculated length L of wire used to interconnect bond sites, where L is at least as long as length F, comprises;
　a. motor-run memory latch means set by said wire sensor detection signal,
　b. monitor means for monitoring an output state of said latch after completing a bonding sequence for forming a wire interconnection between at least one pair of bond sites,
　c. means for providing a pass indication if said output state of said latch indicates that said latch has been set, and a fault indication if said latch has not been set, and
　d. means for resetting said latch.

13. The apparatus of claim 12 further including;
　a. means for determining whether a calculated length $L_1$ of a wire for interconnecting a first pair of bond sites $BS_1$, $BD_1$, is equal to or greater said slack length F,
　b. means for adding to $L_1$ the lengths of a sequence P-1 of additional calculated bond wire lengths $L_2$ through $L_n$ if $L_1$ is less than F until the total calculated length $L_t$ of P bonds is at least as long as said slack length F,
　c. means for initiating a sequence of P pairs of bonding machine actuations to make P pairs of interconnecting bonds after having performed said addition,
　d. means for determining when P pairs of bonding machine actuations have been made, and
　e. means for initiating monitoring of said output state of said motor-run latch after completion of P pairs of bonds.

14. The apparatus of claim 13 wherein said means for determining when said number of actuations of said bonding machine required to make P pairs of bonds between P pairs of bonding sites is further defined as comprising monitoring of the motion of said bonding tool tip, summing the lengths of direction vector movements between each of said P pairs of bond sites, and outputting a test signal for monitoring an output state of said motor-run memory latch when said sum of direction vector lengths is at least as large as said total calculated length $L_t$ of P bond interconnection wire segments.

15. The apparatus of claim 13 wherein said means for determining when said P pairs of bonding machine actuations between P pairs of bond sites has been completed is further defined as comprising counter means for changing a count accumulated in a counter by one count for each said pair of bonding machine actuations, and outputting a test signal for monitoring an output state of said motor-run memory latch when said count of said counter changes by P counts.

16. The apparatus of claim 13 further including calculating means for multiplying said direction vector distance R by a constant β to thereby calculate said length L of an arched wire segment between said bond sites.

17. A method for detecting failure of wire fed through a wire feed bore in an ultrasonic bonding tool of an ultrasonic bonding machine to properly bond to a bond site, said method comprising;
　a. feeding bonding wire to an inlet aperture of a wire feed bore through an ultrasonic bonding tool, said step of feeding bonding wire comprising:
　　(I) providing a wire supply spool means,
　　(ii) providing drive motor means for rotatably supporting said wire supply spool means,
　　(iii) providing outlet wire guide eye means which has therethrough an aperture through which wire from said wire supply spool means is supplied to said entrance opening of said wire feed bore through said bonding tool, (iv) providing means for forming a slack portion of wire of predetermined slack length F between said wire supply spool means and said outlet wire guide eye means, (v) providing wire sensor means for providing a detection signal when the length of said slack portion of wire is shortened by a predetermined amount in response to wire being drawn from an outlet aperture of said wire feed bore of said bonding tool, and (vi) providing motor actuator means responsive to said sensor detection signal in rotating said wire supply spool drive motor means a predetermined angular increment to thereby pay out wire from said wire supply spool means in a forward direction towards said outlet wire guide eye means, thereby restoring said slack portion of wire to said predetermined length F, b. monitoring the length of said bonding wire fed to said bonding tool, c. determining a direction vector distance R between a pair of bond sites comprising a source bond site BS and a destination bond site BD on a workpiece, d. confirming that a length of wire C fed to said bonding tool in forming a wire interconnection bonded at a source end of said wire to said source bond site and at a destination end of said wire to said destination bond site is at least as large as a length L which is at least as large as said vector distance R between said bond sites, and e. outputting a first, pass signal if C is at least as large as L, and a fail signal if C is less than L.

18. The method of claim 17 further including the step of multiplying said direction vector distance R by a constant $\beta$ to thereby calculate said length L of an arched wire segment between said bond sites.

19. The method of claim 17 wherein said step of confirming that said length of wire C fed to said bonding tool in forming a wire interconnection between said pair of bond sites is at least as long as said length L of wire required for an interconnecting wire segment between a pair of bond sites, where L is at least as long as said slack length F, comprising the steps of;

a. setting a motor-run memory latch means in response to said wire detection signal, b. monitoring an output state of said latch after completing a bonding sequence for forming a wire interconnection between at least one pair of bond sites, c. outputting a pass indication signal if said output state of said latch indicates that said latch has been set, and a fault indication signal if said latch has not been set, and d. resetting said latch after outputting said pass or fault indication signal.

20. The method of claim 19 further including the steps of;

a. determining whether a calculated length $L_1$ of a wire for interconnecting a first pair of bond sites $BS_1$, $BD_1$, is equal to greater than said slack length F, b. adding to $L_1$ the lengths of a sequence P-1 of additional calculated bond wire lengths $L_2$ through $L_n$ if $L_1$ is less than F until the total calculated length $L_1$ of P bond interconnecting wire segments is at least as long as said slack length F, c. initiating a sequence of P pairs of bonding machine actuations to make P pairs of interconnecting bonds after having performed said addition, d. determining that P pairs of bonding machine actuations have been made, and e. monitoring said output state of said motor-run latch after completion of P pairs of bonding machine actuations.

21. The method of claim 20 wherein said step for determining that said number of actuations of said bonding machine required to make P pairs of bonds between P pairs of bonding sites have been made is further defined as comprising monitoring of the motion of said bonding tool tip and summing the lengths of direction vector movements between each of said P pairs of bond sites, and outputting a test signal for monitoring an output state of said motor-run memory latch when said sum of direction vector lengths is at least as large as said total calculated length $L_t$ of P bond interconnection wire segments.

22. The method of claim 20 wherein said step for determining that said P pairs of bonding machine actuations between P pairs of bond sites has been completed is further defined as comprising monitoring the output count of counter means for changing a count accumulated in a counter by one count for each said pair of bonding machine actuations, and outputting a test signal for monitoring an output state of said motor-run memory latch when said count of said counter changes by P counts.

23. The method of claim 20 further including the step of multiplying said direction vector distance R by a constant $\beta$ to thereby calculate said length L of an arched wire segment between said bond sites.

* * * * *